United States Patent [19]

Ewart

[11] Patent Number: 4,896,096
[45] Date of Patent: Jan. 23, 1990

[54] REFLECTED SIGNAL MEASUREMENT BLANKING CIRCUIT

[75] Inventor: Glenn R. Ewart, San Jose, Calif.

[73] Assignee: Wiltron Company, Morgan Hill, Calif.

[21] Appl. No.: 176,099

[22] Filed: Mar. 31, 1988

[51] Int. Cl.$^4$ .......................................... G01N 22/00
[52] U.S. Cl. ..................................... 324/642; 324/637
[58] Field of Search ............... 324/58 R, 58 B, 57 SS, 324/58.5 R, 58.5 B, 58 A, 58.5 A

[56] References Cited

U.S. PATENT DOCUMENTS

| 4,758,775 | 7/1988 | Roos ................................. 324/58 B |
| 4,769,598 | 9/1988 | Potter et al. ....................... 324/58 B |

FOREIGN PATENT DOCUMENTS 2165655  4/1986  United Kingdom ............. 324/58 A

OTHER PUBLICATIONS

Yamaguchi et al., "Design Considerations and Performance Evaluation of a Novel V-Band Network Analyzer/Reflection Test Unit," Conference on Precision Electromagnetic Measurements, (7/86), pp. 124–127.

Cronson et al., "A Six Port Automatic Network Analyzer," IEEE Transactions on Microwave Theory and Techniques, vol. MTT-25, No. 12 (12/77), pp. 1086–1091.

Crandell et al., "Reflectometers for Millimeter-Wave Measurements," Microwave Journal, vol. 23, No. 6, (6/80), pp. 59–60, 63.

Primary Examiner—Gerard R. Strecker
Assistant Examiner—Robert W. Mueller
Attorney, Agent, or Firm—Fliesler, Dubb, Meyer & Lovejoy

[57] ABSTRACT

A reflected signal sampler for use in a network analyzer having a pair of diodes for sampling a signal reflected from a device under test (DUT). An amplitude detector for detecting the amplitude of a signal transmitted through the DUT. A reverse bias circuit responsive to the amplitude detector for applying a reverse bias to the diodes when the amplitude of the signal transmitted through the DUT falls below a predetermined magnitude, e.g. −60 db.

12 Claims, 2 Drawing Sheets

REFLECTED SIGNAL MEASUREMENT BLANKING CIRCUIT

BACKGROUND OF THE INVENTION

Cross-Reference to Related Application

U.S. patent application entitled "Microwave Measurement System And Associated Method", invented by Martin I. Grace et al., filed on the same date as the present application, and owned currently and at the time of invention by a common assignee, is incorporated by reference.

Field of the Invention

The present invention relates to network analyzers in general and in particular to a circuit for blanking a reflected signal measurement in a three channel network analyzer when the amplitude of a signal transmitted through a device under test drops below a predetermined magnitude.

Description of the Prior Art

A network analyzer is an apparatus for measuring the performance of a network over a predetermined range of frequencies.

In operation, the input and output ports of the network being tested, also called device under test or DUT, are coupled to the analyzer. Thereafter, a reference signal having a predetermined frequency or range of frequencies is applied to the DUT. The DUT in response to the applied reference signal will transmit or reflect and/or shift the phase of all or part of the applied reference signal depending on the frequency of the applied reference signal. For example, if the DUT is a low pass filter network, a low frequency reference signal applied to the input of the DUT will be transmitted to the output of the DUT with little or no attenuation or phase shift. Concurrently, little if any of the applied reference signal will be reflected at the input to the DUT. However, as the frequency of the applied reference signal is increased and the attenuation and/or phase shift of the applied reference signal in the DUT increases, less of the applied reference signal is transmitted to the output and more is reflected.

The measurements of the amplitude and phase shifts of the transmitted and reflected signals are typically displayed on the network analyzer as a ratio. For example, if the applied reference signal is designated RA, the reflected signal is designated TA and the transmitted signal is designated TB, then the ratios $$S_{21} = \frac{TB}{RA}, \text{ and}$$

$$S_{11} = \frac{TA}{RA}$$

will be a measure of the amplitude and phase shift of the transmitted and reflected signals relative to the applied reference signals, respectively.

The same types of measurements can be and usually are also made in the reverse direction through and from the DUT. When this is done, the applied reference signal is applied to the output of the DUT and designated RB. Under these circumstances, the resulting ratios $$S_{12} = \frac{TA}{RB}, \text{ and}$$

$$S_{22} = \frac{TB}{RB}$$

will be a measure of the amplitude and phase shift of the applied reference signal which is transmitted from the output to the input of the DUT and reflected from the output of the DUT, respectively. For convenience, the subscripts on the letter S define the type of measurement represented by the equations. For example, in the designation $S_{21}$, the first subscript, i.e. 2, designates the port of the DUT at which the measurement is made and the second subscript, i.e. 1, designates the port to which the reference signal is applied.

In practice, the values of the numerators and denominators in the above-described ratios are provided by sampling the applied reference signals RA and RB and the measured signals TA and TB in samplers. The outputs of the samplers are then coupled to mixers in intermediate frequency (IF) stages for generating intermediate frequency signals. The intermediate frequency signals are then processed in the network analyzer to provide the above ratios. For obvious reasons, the ratios $S_{21}$ and $S_{11}$ and the ratios $S_{12}$ and $S_{22}$ are referred to as forward and reverse measurements, respectively.

To provide a maximum amount of information simultaneously to the operator of a network analyzer, it has been found convenient to make and display the results of both forward measurements simultaneously or to make and display the results of both reverse measurements simultaneously. This necessarily requires in either case that at least three channels of measurements be made simultaneously. For the forward measurements, RA, TA and TB must be measured. For the reverse measurements, TB, TB and TA must be measured.

An analysis of the operation of the samplers and IF stages used for making the measurements in a three channel system as described above reveals that when the sampling and intermediate frequencies used are relatively high, e.g. above 20 mHz, and the Q of the IF stages is relatively low, e.g. less than 30, the decay of the output of the reflected signal sampler between samples generates a reflected signal sampler pulse train having a harmonic series of frequencies, all of which are converted by the transmitted signal sampler sampling the signal transmitted through the DUT. When the amplitude of the signal transmitted through the DUT falls below the magnitude of the reflected signal sampler pulse train, the former signal is masked by the latter. This masking limits the precision with which the $S_{21}$ and $S_{12}$ measurements can be made.

SUMMARY OF THE INVENTION

In view of the foregoing, a principal object of the present invention is a reflected signal measurement blanking circuit for blanking or turning off a reflected signal sampler whenever the measured transmitted signal drops below a predetermined magnitude.

Each of the samplers in the apparatus of the present invention comprises a pair of diodes which are used in conjunction with an oscillator for sampling the signal applied to their input. Coupled to the diodes is a source of reverse bias potential. The source of reverse bias potential is coupled to a circuit for measuring the amplitude of the reference signal which is transmitted through the DUT in either the forward or reverse direction. Whenever the transmitted signal falls below a predetermined magnitude, the reverse bias potential is applied to the diodes in the reflected signal sampler involved, turning off the sampler.

Turning off the sampler prevents the reflected signal sampler pulse train from interferring with the measurement of the transmitted reference signal thereby increasing the precision of the measurement by 10 to 15 db.

BRIEF DESCRIPTION OF THE DRAWINGS

The above and other objects, features and advantages of the present invention will become apparent from the following detailed description of the accompanying drawing, in which.

DETAILED DESCRIPTION OF THE DRAWING

Figure 1:
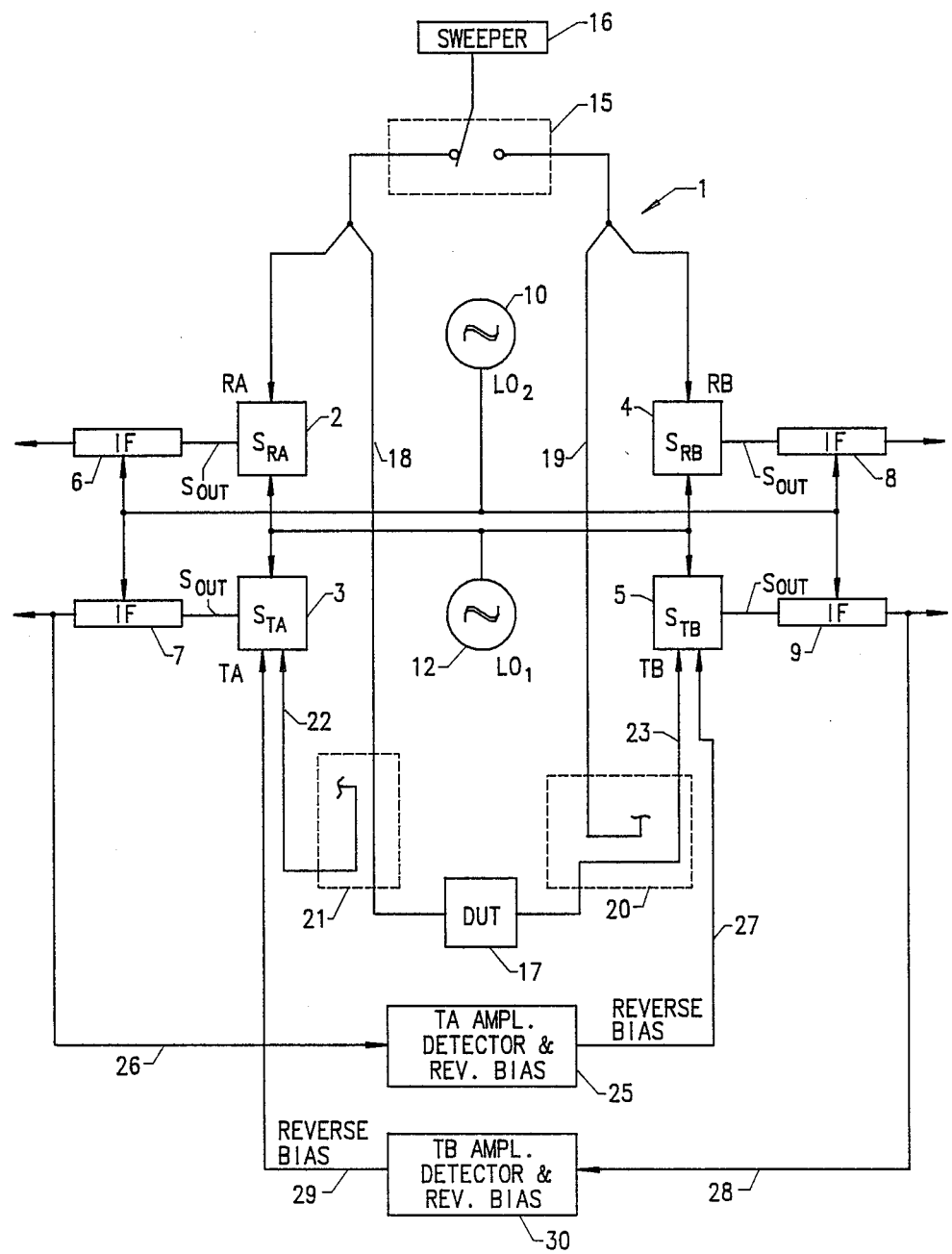
FIG. 1 is a partial block diagram of a network analyzer comprising samplers and sampler blanking circuits according to the present invention.

Referring to FIG. 1, there is provided in accordance with the present invention a network analyzer sampling network designated generally as 1. In the network 1 there is provided a plurality of sampling circuits 2, 3, 4 and 5, also designated $S_{RA}$, $S_{TA}$, $S_{RB}$ and $S_{TB}$, respectively. Coupled to circuits 2–5 there is provided a plurality of IF stages 6, 7, 8 and 9, respectively. Coupled to the IF stages 6–9 there is provided an intermediate frequency reference oscillator 10. Coupled to the sampler circuits 2 and 4 by means of a switch 15 there is provided a sweeper 16. Sweeper 16 provides a reference signal which is swept over the frequency range of from 0.04 gHz to 40 gHz. Coupled to the samplers 2–5 there is further provided a sampler oscillator 12. Sampler oscillator 12 provides an output signal which has a frequency which is swept over the range of 357 megacycles to 536.5 megacycles for producing an output from the samplers having a frequency of 89±4 mHz.

The sweeper 16 is also coupled to the input of a device under test (DUT) 17 by means of a line 18 and to the output of the DUT 17 by means of a line 19 and a coupler 20. The input of the DUT 17 is coupled by means of a coupler 21 and a line 22 to sampler 3. The output of the DUT is coupled by means of a line 23 to the sampler 5. Coupled between the output of the IF stage 7 and the sampler 5 there is provided a signal amplitude detector and reverse bias generating circuit 25 by means of a pair of lines 26 and 27, respectively. Coupled between the output of the IF stage 9 and the sampler 3 by means of a pair of lines 28 and 29 there is provided a signal amplitude detector and reverse bias circuit 30.

Figure 2:
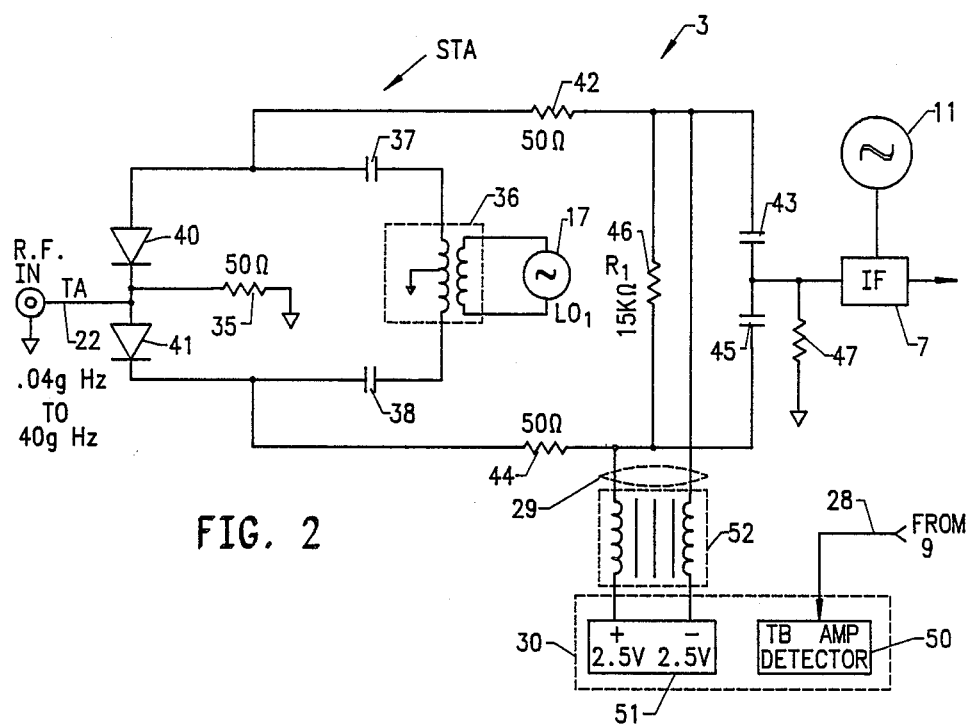
FIG. 2 is a block diagram of a sampler and reflected signal sampler blanking circuit according to the present invention.

Referring to FIG. 2, each of the samplers 2–5 and amplitude detector and reverse bias circuits 25 and 30 are substantially identical. Accordingly, only one of the samplers, i.e. sampler 3, and one of the circuits 25 and 30, i.e. circuit 30, will be described in detail.

In sampler 3 there is provided a pair of diodes 40 and 41 which are coupled to the RF input line 22 and to ground via a 50 ohm resistor 35. The oscillator 12 is coupled to the diodes 40 and 41 through a transformer 36 and a pair of capacitors 37 and 38. Capacitor 37 is coupled to the anode of the diode 40 and capacitor 38 is coupled to the cathode of the diode 41.

The anode of diode 40 is coupled to the IF stage 7 by means of a 50 ohm resistor 42 and a capacitor 43. The cathode of the diode 41 is coupled to the IF stage 7 by means of a 50 ohm resistor 44 and a capacitor 45. A 15K ohm resistor 46 is coupled in parallel with the capacitors 43 and 45. The node between the capacitors 43 and 45 is coupled to ground through a resistor 47.

In the amplitude detector and reverse bias circuit 30 there is provided an amplitude detector 50 coupled to the IF stage 9 for measuring the amplitude of the applied reference signal transmitted through the DUT 17. Coupled to the output of the amplitude detector 50 there is provided a reverse bias generating circuit 51. Reverse bias generating circuit 51 is coupled to the diodes 40 and 41 by means of a choke 52 and the resistors 42 and 44, respectively, in the sampler 3.

Referring again to FIG. 1, the operation of the present invention for making the forward measurements $S_{21}$ and $S_{11}$ will now be described. To make the forward measurements $S_{21}$ and $S_{11}$, the switch 15 at the output of the sweeper 16 is set to couple the output of the sweeper 16 to the reference signal sampler 2 and the input to the DUT 17. Assuming the DUT 17 is a low pass filter, at low frequencies the reference signal will be transmitted through the DUT 17 with little attenuation and phase shift and be sampled by the sampler 5 at a rate determined by the frequency of the oscillator 12. For convenience, when used for making the forward measurements $S_{21}$ and $S_{11}$, the sampler 5 is called the transmitted signal sampler. By means not shown and not pertinent to the present invention, the frequency of the oscillator 12 relative to the frequency of the sweeper 16 is such that the output of the sampler 5 is an amplitude modulated signal having a frequency of 89±4 mHz, as shown in FIG. 3, wherein the solid line designated $RF_{IN}$ is the reference frequency on the line 23 and the broken line designated $S_{out}$ represents the output of the sampler 5.

Figure 3:
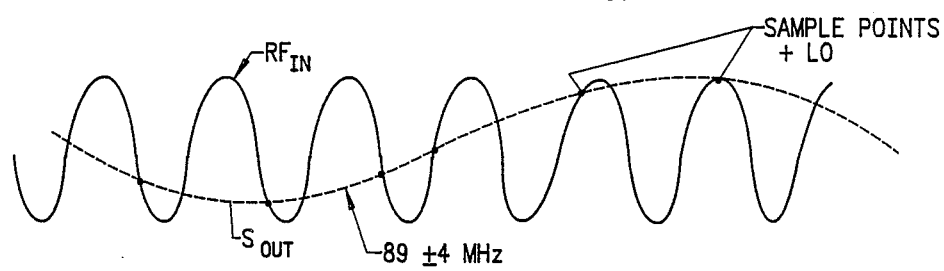
FIG. 3 is a representation of the RF input and IF output of the sampler of FIG. 2.

At the same time, the reference signal $RF_{IN}$ from the sweeper 16 is sampled by the sampler 2 at the rate determined by the frequency of the oscillator 12 for providing an output from the sampler 2 which can also be represented by the waveforms in FIG. 3. It should be understood that while the output of the sampler 2 will have the same frequency as the output of the sampler 5, the amplitude and the phase shift of the output of the sampler 5 will differ from the amplitude and phase shift at the output of the sampler 2 as a result of the attenuation and phase shift of the reference signal in the DUT 17.

Figure 4:
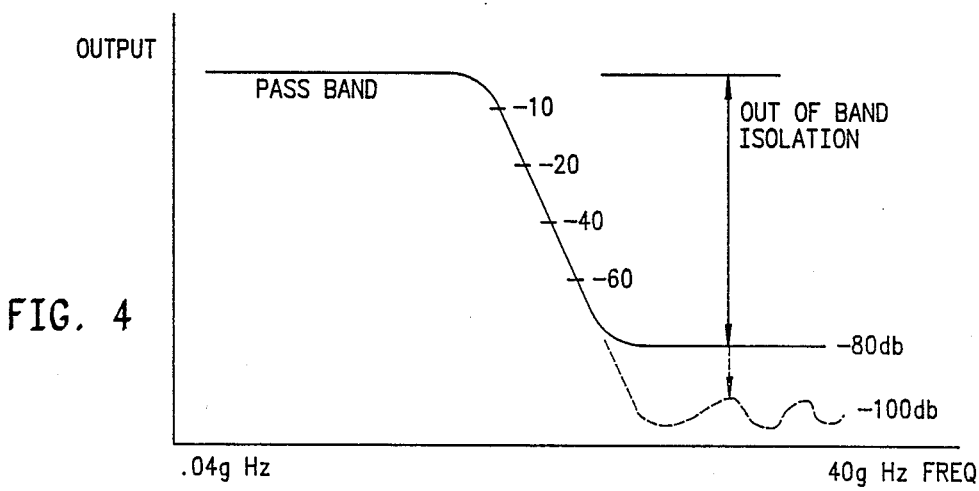
FIG. 4 is a representation of the output of a device under test (low pass filter) as a function of frequency as measured by the network analyzer according to the present invention.

Referring to FIG. 4, as the frequency of the sweeper 16 is increased and approaches the cutoff of the DUT 17 (low pass filter), the magnitude of the output of the DUT 17 will drop sharply, as shown in FIG. 4. At the same time, the reference signal will be reflected from the input of DUT 17. The reflected signal will be coupled to the sampler 3 by means of the coupler 21 and line 22. Once again, the sampler 3 will sample the reflected signal at the frequency of the oscillator 12 and will provide an output signal corresponding to the broken line in FIG. 3 except for differences in the amplitude and phase shift of the output signal. For convenience, when used for making forward measurements $S_{21}$ and $S_{11}$, the sampler 3 is called the reflected signal sampler. The output of the sampler 3 is coupled to the IF stage 7, as described above.

The IF stage 7, as well as the other IF stages 6, 8 and 9, are relatively low Q IF stages, e.g. less than 30. With an IF stage having a low Q and the output of the sampler 3 being a relatively high frequency, e.g. above 20 mHz, the decay of the output of the sampler 3 between samples generates a reflected signal sampler pulse train having a harmonic series of frequencies which are transmitted to the DUT 17 via the line 22 and coupler 21 and through the DUT 17 to the sampler 5 via the line 20. In the sampler 5 the reflected signal sampler pulse train is converted, providing a signal on the output of the sampler 5 which masks the amplitude of the transmitted signal when said amplitude falls below a predetermined magnitude, e.g. −60 to −80 db.

To prevent this masking, the amplitude detector and reverse bias circuit 30 detects the amplitude of the transmitted signal at the output of the IF stage 9. When the amplitude of the transmitted signal at the output of the IF stage 9 drops below a predetermined magnitude, e.g. −60 db, the amplitude detector 50 as shown in FIG. 2 generates a control signal for turning on the reverse bias circuit 51. When the reverse bias circuit 51 is turned on, a reverse bias potential is applied by the circuit 51 through the choke 52 to the diodes 40 and 41 for reverse biasing the diodes 40 and 41. When the diodes 40 and 41 are reverse biased, the sampler 3 is blanked, i.e. ceases to generate a sampler output. Without a sampler output the reflected signal sampler pulse train described above is no longer transmitted through the DUT. When the reflected signal sampler pulse train is no longer transmitted through the DUT 17, the output of the sampler 5 becomes a more accurate measurement of the amplitude of the reference signal appearing on the output of the DUT 17. It is found that by blanking the sampler 3 when the output of the IF stage 9 falls below −60 db, the accuracy of the measurement of the network analyzer 1 is improved by as much or more than 20 db, e.g. from −80 db to −100 db.

While the operation of the blanking circuit of the present invention has been described with respect to the making of forward measurements, the amplitude detector and reverse bias circuit 25 and the blanking of the sampler 5 during reverse signal measurements occurs in the same manner as described above with respect to the blanking of sampler 3. For convenience, when making reverse measurements $S_{12}$ and $S_{22}$, sampler 3 is called the transmitted signal sampler and sampler 5 is called the reflected signal sampler.

While a preferred embodiment of the present invention is described above, it is contemplated that various modifications may be made thereto without departing from the spirit and scope of the present invention. Accordingly, it is intended that the embodiment described be considered only as an illustration of the present invention and that the scope thereof should not be limited thereto but be determined by reference to the claims hereinafter provided.

What is claimed is:

1. A reflected signal measurement blanking circuit for use in a network analyzer comprising:

first means, including means for coupling said first means to a first port of a device under test, for measuring the magnitude of a signal reflected from said device under test in said network analyzer;

second means, including means for coupling said second means to a second port of said device under test, for measuring the magnitude of a signal transmitted through said device under test in said network analyzer; and means coupled between said first means and said second means which is responsive to said second means for blanking said reflected signal measurement when said magnitude of said transmitted signal falls below a predetermined magnitude.

2. A reflected signal measurement blanking circuit for use in a network analyzer according to claim 1 wherein each of said first and said second measuring means comprises a sampler for sampling said reflected signal and said transmitted signal at a predetermined sampling rate, respectively; and said blanking means comprises means for turning off said sampler in said first means when said magnitude of said transmitted signal falls below a predetermined magnitude.

3. A reflected signal measurement blanking circuit for use in a network analyzer according to claim 1 wherein each of said first and said second measuring means comprises diode means coupled to an oscillator having a predetermined frequency for sampling said reflected and transmitted signals at said predetermined frequency, respectively; and said blanking means comprises means for applying a reverse bias potential to said diode means.

4. A reflected signal measurement blanking circuit for use in a network analyzer according to claim 1 wherein said predetermined magnitude comprises −60 db.

5. A reflected signal measurement blanking circuit for use in a network analyzer having means for providing a signal to a first port of a device under test, reflected signal sampling means coupled to said first port for providing a reflected signal having a magnitude which is proportional to the magnitude of said signal which is reflected from said first port, and transmitted signal sampling means coupled to a second port of said device under test for providing a transmitted signal having a magnitude which is proportional to the magnitude of said signal which is transmitted from said first port through said device under test to said second port comprising:

means coupled to said transmitted signal sampling means and said reflected signal sampling means for blanking said reflected signal sampling means when said magnitude of the output of said transmitted signal sampling means is less than a predetermined magnitude.

6. A blanking circuit according to claim 5 wherein said reflected signal sampling means comprises diode means and said blanking means comprises means for rendering said diode means non-conductive.

7. A blanking circuit according to claim 6 wherein said rendering means comprises means for providing a reverse bias potential to said diode means.

8. A blank circuit according to claim 7 wherein said reverse bias providing means comprises inductive means for blocking signals having a predetermined frequency from interfering with said reverse bias providing means.

9. A reflected signal measurement blanking circuit for use in a network analyzer comprising:

first means for measuring the magnitude of a signal reflected from a device under test in said network analyzer, said first means comprising diode means coupled to an oscillator having a predetermined frequency for sampling said reflected signal at said predetermined frequency;

second means for measuring the magnitude of a signal transmitted through said device under test in said network analyzer, said second means comprising diode means coupled to an oscillator having a predetermined frequency for sampling said transmitted signal at said predetermined frequency, and means coupled to said first means which is responsive to said transmitted signal measuring means for blanking said reflected signal measurement when said magnitude of said transmitted signal falls below a predetermined magnitude, said blanking means comprising means for applying a reverse bias potential to said diode means.

10. A reflected signal measurement blanking circuit for use in a network analyzer according to claim 9 wherein said predetermined magnitude comprises −60 db.

11. A reflect signal measurement blanking circuit for use in a network analyzer having means for providing a signal to a first port of a device under test, reflected signal sampling means comprising diode means coupled to said first port for providing a reflected signal having a magnitude which is proportional to the magnitude of said signal which is reflected from said first port, and transmitted signal sampling means coupled to a second port of said device under test for providing a transmitted signal having a magnitude which is proportional to the magnitude of said signal which is transmitted from said first port through said device under test to said second port comprising:

means coupled to said transmitted signal sampling means and said reflected signal sampling means for providing a reverse bias potential to said diode means when said magnitude of the output of said transmitted signal sampling means is less than a predetermined magnitude.

12. A blanking circuit according to claim 11 wherein said reverse bias providing means comprises inductive means for blocking signals having a predetermined frequency from interfering with said reverse bias providing means.

* * * * *

UNITED STATES PATENT AND TRADEMARK OFFICE
CERTIFICATE OF CORRECTION

PATENT NO. : 4,896,096
DATED : January 23, 1990
INVENTOR(S) : GLENN R. EWART

It is certified that error appears in the above-identified patent and that said Letters Patent is hereby corrected as shown below:

Column 2, line 38, after "measurements," "TB," should be "RB,". (1st occurrence)

Signed and Sealed this

Twenty-seventh Day of November, 1990

Attest:

HARRY F. MANBECK, JR.

Attesting Officer

Commissioner of Patents and Trademarks